(12) United States Patent
Park et al.

(10) Patent No.: US 11,030,952 B2
(45) Date of Patent: *Jun. 8, 2021

(54) PIXEL AND DISPLAY DEVICE HAVING THE SAME

(71) Applicant: Samsung Display Co., LTD., Yongin-si (KR)

(72) Inventors: Jun-Hyun Park, Suwon-si (KR); Young-Wan Seo, Suwon-si (KR); An-Su Lee, Seoul (KR); Bo-Yong Chung, Suwon-si (KR); Kang-Moon Jo, Hwaseong-si (KR); Chong-Chul Chai, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/734,709

(22) Filed: Jan. 6, 2020

(65) Prior Publication Data

US 2020/0143742 A1    May 7, 2020

Related U.S. Application Data

(63) Continuation of application No. 15/862,944, filed on Jan. 5, 2018, now Pat. No. 10,540,927.

(30) Foreign Application Priority Data

Feb. 6, 2017  (KR) .......................... 10-2017-0016283

(51) Int. Cl.
*G09G 3/3233* (2016.01)
*H01L 51/52* (2006.01)
(Continued)

(52) U.S. Cl.
CPC ......... *G09G 3/3233* (2013.01); *G09G 3/3258* (2013.01); *H01L 51/5203* (2013.01);
(Continued)

(58) Field of Classification Search
CPC ............... G09G 3/3233; G09G 3/3258; G09G 2300/0814; G09G 2320/0233;
(Continued)

(56) References Cited

U.S. PATENT DOCUMENTS

| 7,561,129 B2 | 7/2009 | Lee et al. |
| 8,035,596 B2 | 10/2011 | Sekine |

(Continued)

FOREIGN PATENT DOCUMENTS

KR    10-2014-0033791       3/2014

*Primary Examiner* — Rodney Amadiz
(74) *Attorney, Agent, or Firm* — Kile Park Reed & Houtteman PLLC

(57) ABSTRACT

A display panel driver drives pixels based on first power having at least three voltage levels, second power having a constant voltage, and third power having two voltage levels. Each pixel includes a first transistor connected between first and second nodes and including a gate electrode to receive a scan signal, a second transistor connected between the second node and a third node in series with the first transistor and including a gate electrode to receive the third power, and a driving transistor connected between a source of the first power and the third node and including a gate electrode connected to the first electrode to control a driving current for an organic light emitting diode. A first capacitor is connected between a source of the third power and the first node, and a second capacitor is connected between the second node and one of the data lines.

20 Claims, 14 Drawing Sheets

(51) Int. Cl.
*G09G 3/3258* (2016.01)
*H01L 27/32* (2006.01)

(52) U.S. Cl.
CPC ........... *G09G 2300/0814* (2013.01); *G09G 2300/0819* (2013.01); *G09G 2310/0264* (2013.01); *G09G 2320/0223* (2013.01); *G09G 2320/0233* (2013.01); *H01L 27/3265* (2013.01)

(58) Field of Classification Search
CPC ... G09G 2300/0819; G09G 2320/0223; G09G 2310/0264; G09G 3/3208; H01L 51/5203; H01L 27/3265
See application file for complete search history.

(56) References Cited

U.S. PATENT DOCUMENTS

| | | | |
|---|---|---|---|
| 8,441,014 B2 | 5/2013 | Yamazaki et al. | |
| 9,633,625 B2 | 4/2017 | Kumeta et al. | |
| 2015/0356921 A1* | 12/2015 | Lee | G09G 3/3233 345/699 |
| 2016/0275869 A1 | 9/2016 | Hwang et al. | |

* cited by examiner

PIXEL AND DISPLAY DEVICE HAVING THE SAME

CROSS REFERENCE TO RELATED APPLICATION

This is a continuation application based on currently pending U.S. patent application Ser. No. 15/862,944, filed on Jan. 5, 2018, the disclosure of which is incorporated herein by reference in its entirety. U.S. patent application Ser. No. 15/862,944 claims priority benefit of Korean Patent Application No. 10-2017-0016283, filed on Feb. 6, 2017 in the Korean Intellectual Property Office and entitled, "Pixel and Display Device Having the Same," the disclosure of which is incorporated herein by reference in its entirety for all purposes.

BACKGROUND

1. Field

One or more embodiments described herein relate to a display device.

2. Description of the Related Art

A display device includes a plurality of pixels that emit light for forming an image. Each pixel emit light based on a corresponding data voltage. A display device controlled by a progressive emission method is sequentially driven in a row-by-row basis to emit light. A display device controlled by a simultaneous emission method emits light from all pixels simultaneously.

When driven by the simultaneous emission method, each pixel may compensate the threshold voltage of its driving transistor and initialize the anode voltage of its organic light emitting diode in order to improve display quality. However, the circuit elements used for compensation and initialization increase pixel size. This makes the formation of high resolution displays difficult.

Also, in each pixel, a current leakage path from the driving transistor to the organic light emitting diode may be formed during a data writing period when the display device is driven in the simultaneous emission method. As a result, display defects (e.g., luminance unevenness, cross-talk, etc.) may be visible.

SUMMARY

In accordance with one or more embodiments, a display device includes a display panel including a plurality of pixels; and a display panel driver to drive a plurality of scan lines and a plurality of data lines and to provide first power having at least three voltage levels, second power having a constant voltage, and third power having two voltage levels, wherein each of the pixels includes: a first transistor connected between a first node and a second node and including a gate electrode to receive a scan signal; a second transistor connected between the second node and a third node in series with the first transistor and including a gate electrode to receive the third power; a driving transistor connected between a source of the first power and the third node and including a gate electrode connected to a first electrode to control a driving current; an organic light emitting diode, between the third node and a source of the second power, to emit light based on the driving current; a first capacitor connected between a source of the third power and the first node; and a second capacitor connected between the second node and one of the data lines.

The display panel may be driven in a frame which includes: a first initialization period to initialize a third node voltage, a second initialization period after the first initialization period to initialize a gate voltage of the driving transistor, a compensation period after the second initialization period to compensate a threshold voltage of the driving transistor, a writing period after the compensation period to sequentially write data voltages, and an emission period after the writing period in which the pixels are to simultaneously emit light. The driving transistor, the first transistor, and the second transistor may be n-channel metal oxide semiconductor (NMOS) transistors.

The first power may have one of a first voltage level, a second voltage level less than the first voltage level, or a third voltage level greater than the first voltage level, and the third power may have one of a first initialization voltage level to turn on the second transistor or a second initialization voltage level less than the first initialization voltage level to turn off the second transistor.

In the first initialization period, the first power has the first voltage level less than the second power, the third power has the first initialization voltage level, and the scan signal has a turn-off level. In the second initialization period, the first power has the second voltage level, the third power has the first initialization voltage level, and the scan signal has a turn-on level. In the compensation period, the first power has the second voltage level, the third power has the first initialization voltage level, and the scan signal has a turn-on level. In the writing period, the first power has the third voltage level greater than the second power, the third power has the second initialization voltage level, and the scan signal has a turn-on level and is to be sequentially provided to the scan lines in an order of pixel rows. The second transistor may be turned off to electrically disconnect the first node and the third node in the writing period.

In the emission period, the first power has the third voltage level greater than the second power, the third power has the first initialization voltage level, and the scan signal has a turn-off level.

In the writing period, the first power may have the first voltage level or the third voltage level, the third power may have the second initialization voltage level, and the scan signal may have a turn-on level and is to be sequentially provided to the scan lines in an order of pixel rows.

In the emission period, the first power may have a fourth voltage level greater than the third voltage level, the third power may have the first initialization voltage level, and the scan signal may have a turn-off level. The driving transistor and the second transistor may be n-channel metal oxide semiconductor (NMOS) transistors, and the first transistor may be a p-channel metal oxide semiconductor (PMOS) transistor.

The display panel driver may provide the first power at a first voltage level less than the second power during the first and second initialization periods, provide the first power at a second voltage level less than the first voltage level during the compensation period, and provide the first power at a third voltage level greater than the second power during the writing and emission periods.

The display panel driver may provide the first power at a first voltage level less than the second power during the first and second initialization periods, provide the first power at a second voltage level less than the first voltage level during the compensation period, provide the first power at a third voltage level greater than the first voltage level during the writing period, and provide the first power at a fourth voltage level greater than the first voltage level and the second power during the emission period.

In accordance with one or more other embodiments, a pixel includes a first transistor connected between a first node and a second node and including a gate electrode to receive a scan signal; a second transistor connected between the second node and a third node in series with the first transistor and including a gate electrode to receive an initialization power having two voltage levels; a driving transistor connected between a source of first power having at least three voltage levels and the third node, the driving transistor including a gate electrode connected to the first electrode to control a driving current; an organic light emitting diode connected between the third node and a source of second power to emit light based on the driving current; a first capacitor connected between a source of third power and the first node; and a second capacitor connected between the second node and a data lines.

The driving transistor and the first transistor may be different types of metal oxide semiconductor (MOS) transistors. The driving transistor and the second transistor may be n-channel metal oxide semiconductor (NMOS) transistors, and the first transistor may be a p-channel metal oxide semiconductor (PMOS) transistor. The first transistor may be a low temperature poly silicon (LTPS) thin film transistor. The second transistor may be an oxide thin film transistor or a low temperature poly silicon LTPS thin film transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
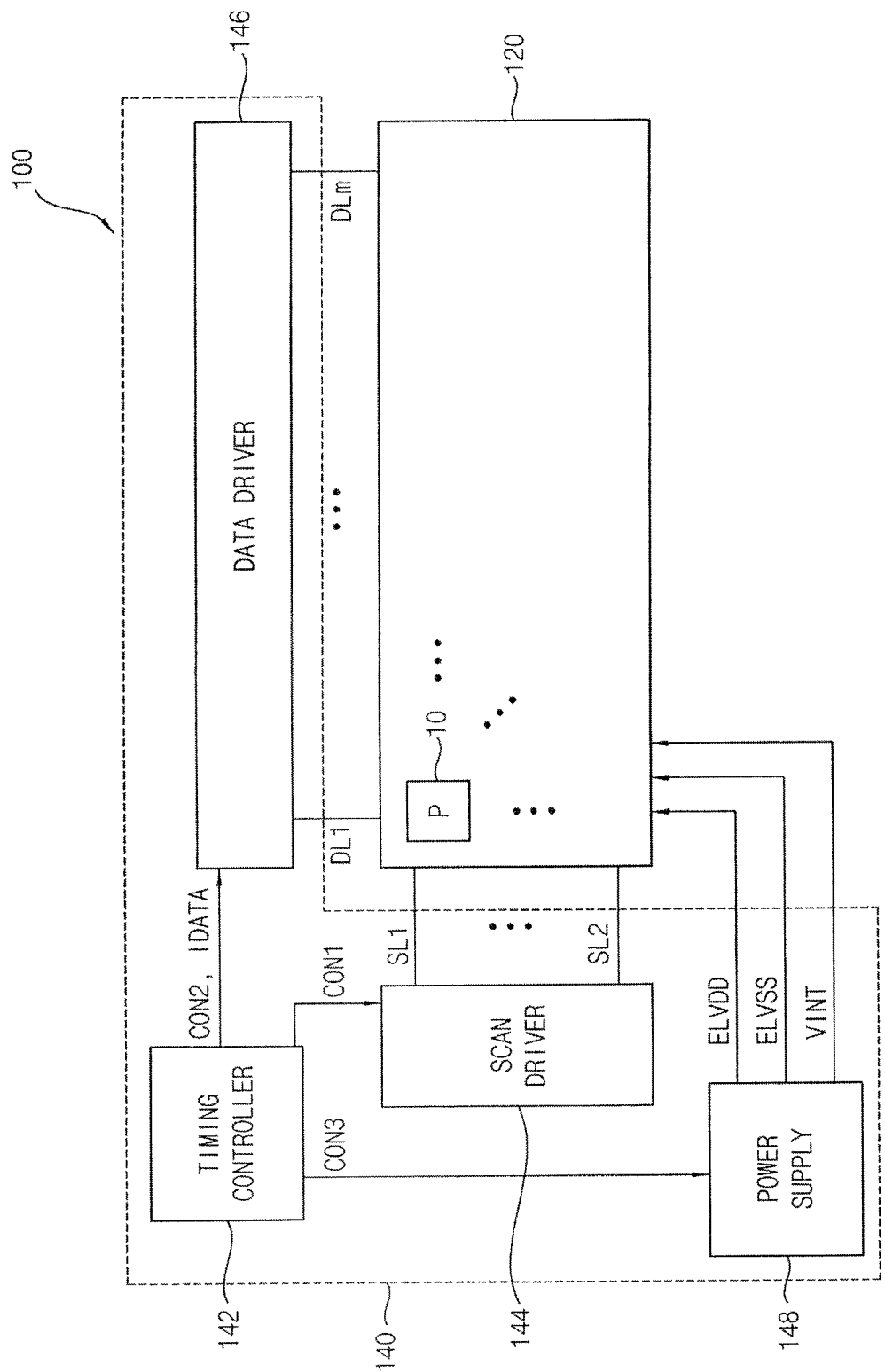
FIG. 1 illustrates an embodiment of a display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
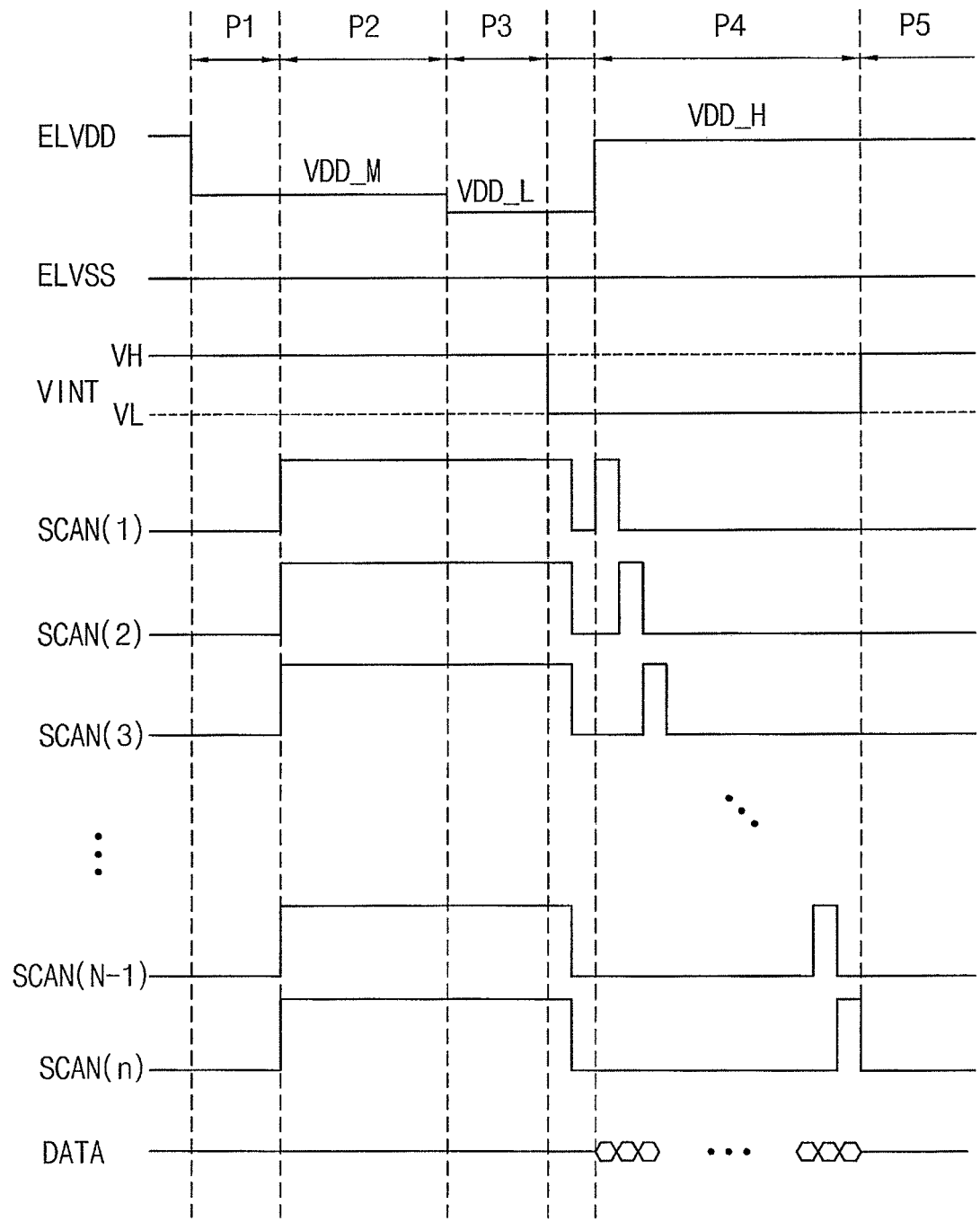
FIG. 2 illustrates an embodiment of signals for controlling the display device.

FIG. 1 illustrates an embodiment of a display device 100, and FIG. 2 illustrate an embodiment of a timing diagram for controlling the display device 100. Referring to FIGS. 1 and 2, the display device 100 may include a display panel 120 and a display panel driver 140. The display device 100 may display an image by a progressive scan and simultaneous emission method. The display device 100 may be implemented by an organic light emitting display device and applied to a flat display device, a flexible display device, a transparent display device, and a head mount display (HMD) device.

The display panel 120 may include a plurality of scan lines SL1 to SLn, a plurality of data lines DL1 to DLm, and a plurality of pixels connected to the scan lines SL1 to SLn and the data lines DL1 to DLm, where n and m are integers greater than 1.

Each of the pixels 10 may include a first transistor connected between a first node and a second node and having a gate electrode to receive a scan signal, a second transistor connected between the second node and a third node in series with the first transistor and having a gate electrode to receive a third power VINT (e.g., an initialization power), a driving transistor connected between a first power ELVDD and the third node and having a gate electrode connected to the first electrode to control a driving current, an organic light emitting diode connected between the third node and a second power ELVSS to emit light based on the driving current, a first capacitor connected between the third power VINT and the first node, and a second capacitor connected between the second node and one of the data lines.

In some embodiments, the display panel driver 140 is driven based on a frame which includes a first initialization period P1 to initialize a third node voltage (e.g., a voltage at the third node), a second initialization period P2 after the first initialization period P1 to initialize a gate voltage of the driving transistor, a compensation period P3 after the second initialization period P2 to compensate a threshold voltage of the driving transistor, writing period P4 after the compensation period P3 to sequentially write data voltages, and an emission period P5 after the writing period P4 in which the pixels 10 simultaneously emit light.

The display panel driver 140 may drive the scan lines SL1 to SLn and the data lines DL1 to DLm and may provide the first power ELVDD, the second power ELVSS, and the third power VINT to the display panel 120. The first power ELVDD may have at least three voltage levels (e.g., VDD_M, VDD_L, and VDD_H in FIG. 2), the second power ELVSS may be a constant voltage, and the third power VINT may have two voltage levels (e.g., VH and VL in FIG. 2). The display panel driver 140 may include a timing controller 142, a scan driver 144, a data driver 146, and a power supply 160.

The timing controller 142 may control the scan driver 144, the data driver 146, and the power supply 148. The timing controller 142 may respectively provide first to third control signals CON1, CON2, and CON3 to the scan driver 144, the data driver 146, and the power supply 148. In some embodiments, the timing controller 142 may receive RGB image signals, a vertical synchronization signal, a horizontal synchronization signal, a main clock signal, a data enable signal, etc., and generate image data IDATA corresponding to the RGB image signals and the first to third control signals CON1, CON2, and CON3 based on these signals.

The scan driver 144 may provide scan signal SCAN(1) to SCAN(n) to the scan lines SL1 to SLn based on the first control signal CON1. In some embodiments, the scan driver 144 may simultaneously output the scan signals SCAN(1) to SCAN(n) having a turn-on level to the scan lines SL1 to SLn during the second initialization period P2 and the compensation period P3. The turn-on level may be a voltage level of the scan signals SCAN(1) to SCAN(n) to turn on the transistor to which the scan signals SCAN(1) to SCAN(n) is applied. Accordingly, the gate voltage of the driving transistor and the anode voltage of the organic light emitting diode of all the pixels 10 may be initialized to a certain voltage level and the threshold voltage of the driving transistor of all the pixels 10 may be compensated. In some embodiments, the scan driver 144 may sequentially provide the scan signal with a turn-on level to pixel rows respectively corresponding to the scan lines SL1 to SLn during the writing period P4.

The data driver 146 may generate the data signal (data voltage) based on the second control signal CON2 and the image data IDATA from the timing controller 142. The data driver 146 may provide the data signal to the pixels 10 through the data lines DL1 to DLm during the writing period P4.

The power supply 148 may provide the first to third powers ELVDD, ELVSS, and VINT to the display panel 120. The first power ELVDD may have one of first voltage level VDD_M, second voltage level VDD_L, or third voltage level VDD_H. In some embodiments, the second voltage level VDD_L may be less than the first voltage level VDD_M and the third voltage level VDD_H may be greater than the first voltage level VDD_M. The first voltage level may be less than the second power ELVSS and the third voltage level VDD_H may be greater than the second power ELVSS. The third power (i.e., the initialization power) VINT may have one of first initialization voltage level VH and a second initialization voltage level VL less than the first initialization voltage level VH. The second transistor in the pixel 10 may be turned on by the first initialization voltage level VH and turned off by the second initialization voltage level VL. The second initialization voltage level VL may be a sufficiently low value that no current flows through the second transistor. The third power VINT may be connected to one end of the first capacitor in the pixel 10 to continuously apply a predetermined voltage to the first capacitor.

In some embodiments, when the driving transistor is implemented in an n-channel metal oxide semiconductor (NMOS) transistor, the display panel driver 140 (e.g., power supply 148) may provide the first power ELVDD having the first voltage level VDD_M in the first and second initialization periods P1 and P2, provide the first power ELVDD having the second voltage level VDD_L in the compensation period P3, and provide the first power ELVDD having the third voltage level VDD_H in the writing and emission periods P4 and P5. Accordingly, the first power ELVDD may have less voltage level than the second power ELVSS in the first initialization period P1, the second initialization period P2, and the compensation period P3, so that unintended emission of light from the organic light emitting diode due to current leakage at the driving transistor, and/or an increase of an anode voltage of the organic light emitting diode, may be prevented.

The second power ELVSS may have a predetermined constant voltage level, e.g., a direct current (DC) voltage. For example, the second power ELVSS may be a ground voltage or a predetermined negative voltage.

In the first initialization period P1, the first power ELVDD may have the first voltage level VDD_M, the third power VINT may have the first initialization voltage level VH, and the scan signals SCAN(1) to SCAN(n) may have the turn-on level. Thus, the anode voltage of the organic light emitting diode in each of the pixels 10 may be initialized to the first voltage level VDD_M.

In the second initialization period P2, the first power ELVDD may have the first voltage level VDD_M, the third power VINT may have the first initialization voltage level VH, and the scan signals SCAN(1) to SCAN(n) may have the turn-on level. Thus, the anode voltage of the organic light emitting diode and the gate voltage of the driving transistor in each of the pixels 10 may be initialized to a sum of the first voltage level VDD_M and the threshold voltage of the driving transistor (e.g., VDD_M+Vth, Vth is the threshold voltage of the driving transistor).

In the compensation period P3, the first power ELVDD may have the second voltage level VDD_L, the third power VINT may have the first initialization voltage level VH, and the scan signals SCAN(1) to SCAN(n) may have the turn-on level. Thus, the anode voltage of the organic light emitting diode and the gate voltage of the driving transistor in each of the pixels 10 may be initialized to a sum of the second voltage level VDD_L and the threshold voltage of the driving transistor (e.g., VDD_L+Vth).

In the writing period P4, the first power ELVDD may have the third voltage level VDD_H greater than the second power ELVSS, the third power VINT may have the second initialization voltage level VL, and the scan signals SCAN(1) to SCAN(n) may sequentially have the turn-on level in order of pixel rows. Thus, the data voltages DATA may be sequentially written on the pixel rows through the data lines DL1 to DLm. The gate voltage of the driving transistor of each pixel 10 may include a data voltage component.

In the emission period P5, the first power ELVDD may have the third voltage level VDD_H, the third power VINT may have the first initialization voltage level VH, and the scan signals SCAN(1) to SCAN(n) may have the turn-off level. Thus, all the pixels 10 may simultaneously emit light based on respective data voltages DATA.

As described above, the display device 100 according to example embodiments may perform the simultaneous emission using 3T2C (3 transistors and 2 capacitors) pixel structure. The initialization and compensation for the gate voltage of the driving transistor and the anode voltage of the organic light emitting diode may be stably performed without current leakage based on the voltage level change of the first power ELVDD. In addition, the second power ELVSS of the simultaneous emission display device may be the constant voltage, so that the powers may be stably applied to the display panel 120 and IR-drop in the display panel 120 may be improved.

Figure 3:
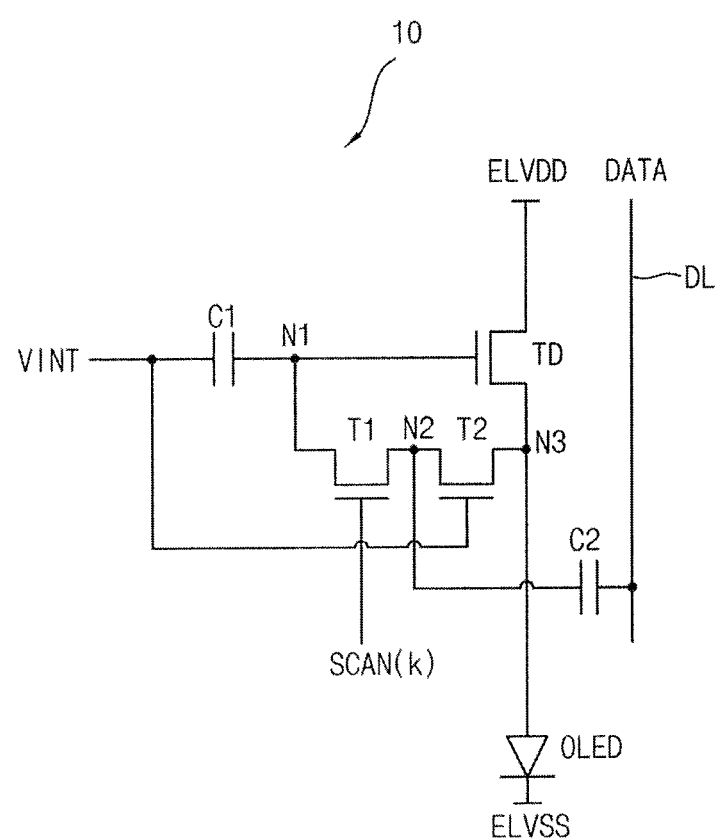
FIG. 3 illustrates an embodiment of a pixel.
Figure 4:
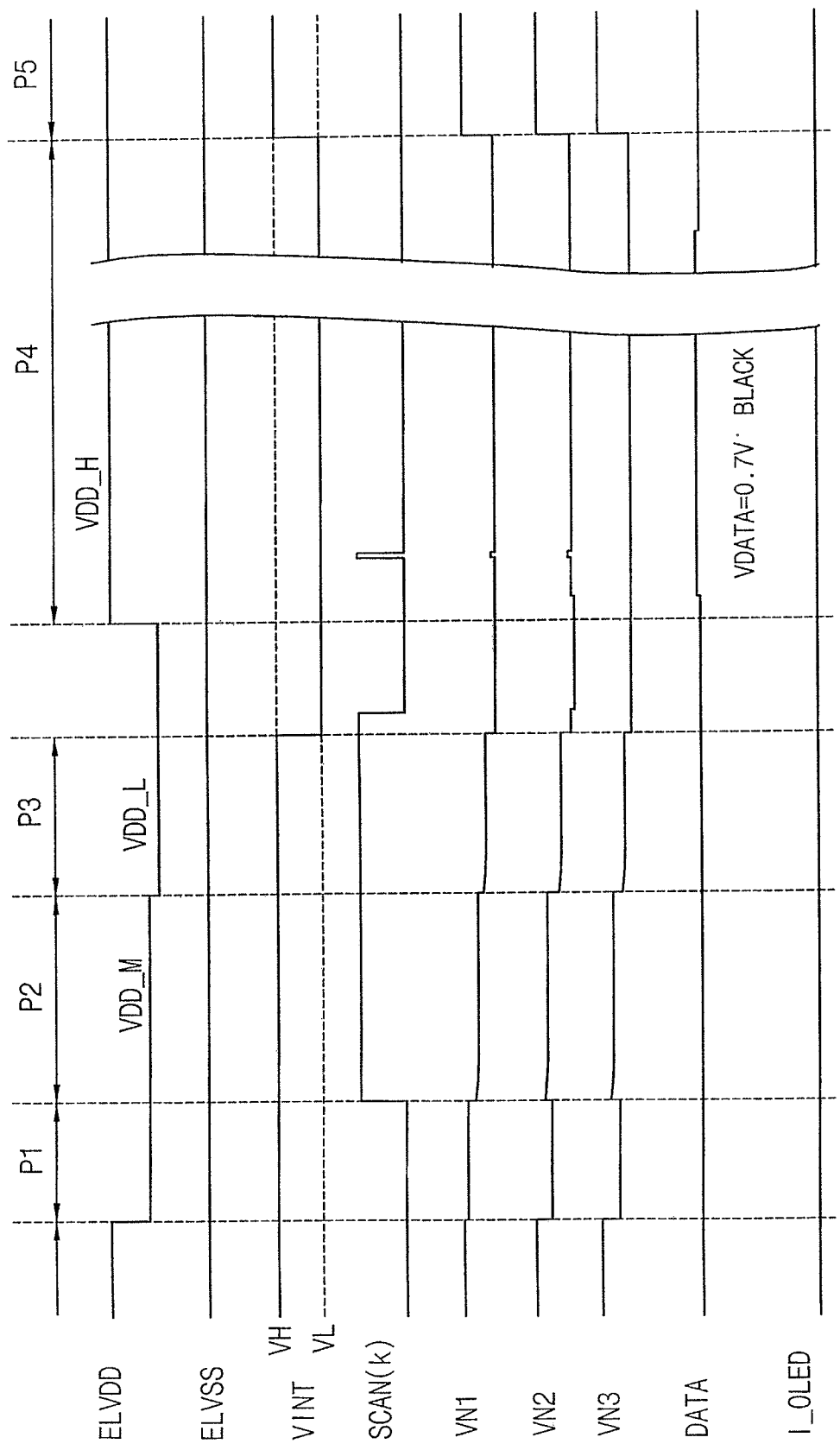
FIG. 4 illustrates an embodiment of signals for controlling the pixel.
Figure 5:
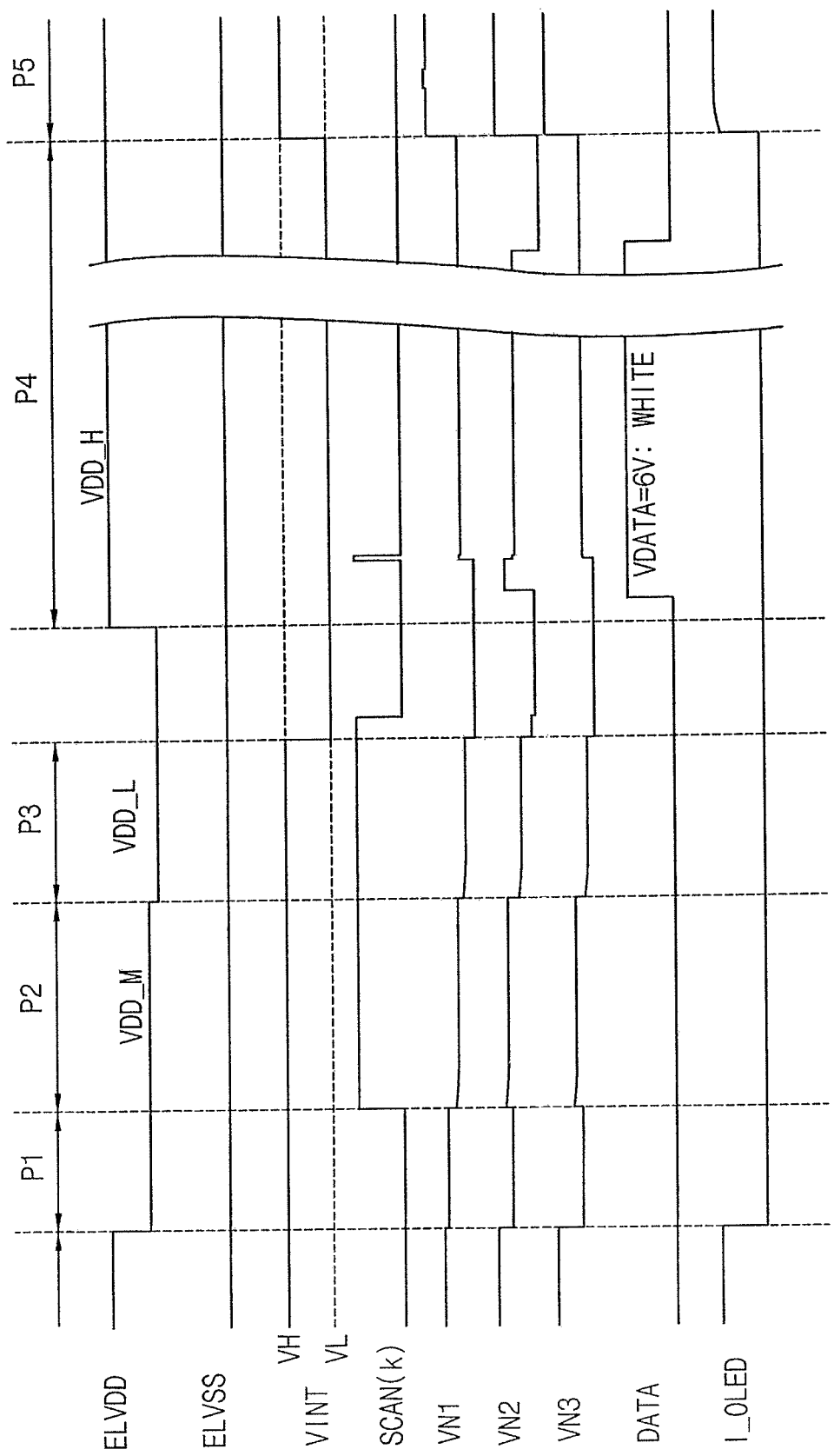
FIG. 5 illustrates another embodiment of signals for controlling the pixel.

FIG. 3 illustrates an embodiment of a pixel 10. FIG. 4 illustrates a timing diagram for controlling the pixel 10. FIG. 5 illustrates another timing diagram for controlling the pixel 10.

Referring to FIGS. 3 to 5, the pixel 10 may include a first transistor T1, a second transistor T2, a driving transistor TD, a first capacitor C1, a second capacitor C2, and an organic light emitting diode OLED. FIG. 4 shows operation of the pixel 10 when displaying a black image and voltage changes at each node in the pixel 10. FIG. 5 shows operation of the pixel 10 when displaying a white image (or a maximum grayscale level image) and voltage changes at each node in the pixel 10.

In some embodiments, the pixel 10 may be in the display device driven as the simultaneous emission method. In some embodiments, the first transistor T1, the second transistor T2, and the driving transistor TD may be NMOS transistors. For example, each of the first transistor T1, the second transistor T2, and the driving transistor TD may be implemented in a low temperature poly silicon (LTPS) thin film transistor, an oxide thin film transistor, or a low temperature polycrystalline oxide (LTPO) thin film transistor.

In FIGS. 3 to 5, the pixel 10 may be arranged in a K-th pixel row connected to a K-th scan line, where K is a positive integer.

The first transistor T1 may be connected between a first node N1 and a second node N2. The first transistor T1 may include a gate electrode to receive a scan signal SCAN(k). The first transistor T1 may be turned on by a turn-on level of the scan signal SCAN(k) to electrically short-circuit the gate electrode and a source electrode of the driving transistor TD or to transmit the data voltage VDATA to the gate electrode of the driving transistor TD.

The second transistor T2 may be connected between the second node N2 and a third node N3 in series with the first transistor T1. The second transistor T2 may include a gate electrode to receive a third power VINT (e.g., an initialization power VINT). The third power VINT may have one of a first initialization voltage level VH or a second initialization voltage level VL less than the first initialization voltage level VH. The second transistor T2 may be turned on by the first initialization voltage level VH of the third power VINT to electrically short-circuit the gate electrode and a source electrode of the driving transistor TD with the first transistor T1 or to be electrically connected to the data line DL. The second transistor T2 may be turned off by the second initialization voltage level VL of the third power VINT.

The driving transistor TD may be connected between the first power ELVDD and the third node N3. The driving transistor TD may include a gate electrode connected to the first node N1. Emission luminance may be determined by a driving current I_OLED flowing through the driving transistor TD. In some embodiments, the gate electrode of the driving transistor TD may correspond to the first node N1 and the source electrode of the driving transistor TD may correspond to the third node N3.

The first capacitor C1 may be connected between the third power VINT and the first node N1. The second capacitor C2 may be connected between the second node N2 and the data line DL. The gate voltage of the driving transistor TD in the writing period P$ may be determined by voltages stored in the first and second capacitors C1 and C2.

The organic light emitting diode OLED may be connected between the third node N3 and the second power ELVSS. In some embodiments, an anode of the organic light emitting diode OLED may correspond to the third node N3.

As illustrated in FIG. 4, during the first initialization period P1, the first power ELVDD may have a first voltage level VDD_M, the third power VINT may have the first initialization voltage level VH, and the scan signal SCAN(k) may have the turn-off level. Accordingly, the second transistor T2 may be turned on, the second node N2 and the third node N3 may be electrically shorted, and the second node N2 and the third node N3 may have the first voltage level VDD_M. For exapmle, the anode voltage of the organic light emitting diode OLED may be initialized to the first voltage level VDD_M. At this time, a residue voltage due to an emission in a previous frame may remain in a first node voltage VN1, e.g., the gate voltage of the driving transistor TD.

In the second initialization period P2, the first power ELVDD may have the first voltage level VDD_M, the third power VINT may have the first initialization voltage level VH, and the scan signal SCAN(k) may have the turn-on level. Accordingly, the first and second transistors T1 and T2 that are connected in series may be turned on and the first node N1, the second node N2, and the third node N3 may be electrically shorted. Thus, the driving transistor TD may be diode-connected. The first node voltage VN1 (e.g., the gate voltage of the driving transistor TD), a second node voltage VN2, and a third node voltage VN3 (e.g., the anode voltage) may have a value corresponding to a sum of the first voltage level VDD_M and a threshold voltage of the driving transistor TD (e.g., represented as VDD_M+Vth). The anode voltage of the organic light emitting diode OLED and the gate voltage of the driving transistor TD may be initialized to VDD_M+Vth.

In the compensation period P3, the first power ELVDD may have the second voltage level VDD_L, the third power VINT may have the first initialization voltage level VH, and the scan signal SCAN(k) may have the turn-on level. Accordingly, the driving transistor TD may maintain the diode-connected state, and the first to third node voltages VN1, VN2, and VN3 may be changed to a sum of the second voltage level VDD_L and the threshold voltage of the driving transistor Vth (VDD_L+Vth).

In the writing period P4, the first power ELVDD may have the third voltage level VDD_H greater than the second power ELVSS. The third power VINT may have the second initialization voltage level VL. The scan signal SCAN(k) may have the turn-on level. Accordingly, when the data voltage VDATA is written, the first transistor T1 may be turned on and the second transistor T2 may be turned off. In some embodiments, the third voltage level VDD_H may be a sufficiently high voltage greater than the second power ELVSS to drive the driving transistor TD in a saturation region. The first node N1 to which the data voltage VDATA is applied and the third node may be electrically disconnected by the operation of the first and second transistors T1 and T2. Thus, current leakage through the driving transistor TD and the fluctuation of the anode voltage (the third node voltage VN3) caused thereby may be prevented.

In one embodiment, charge stored in the first capacitor C1, second capacitor C2, and a capacitor of the organic light emitting diode OLED (e.g., a parasitic capacitor) at the start point of the writing period P4 (e.g., at a first time point) may be expressed by Equations 1 to 3 respectively:

$$Q11 = (VDD\_L + Vth\ VL) \times Cc1 \tag{1}$$

$$Q21 = (VDD\_L + Vth\ Vref) \times Cc2 \tag{2}$$

$$Q31 = (VDD\_L + Vth\text{ELVSS}) \times \text{Coled} \quad (3)$$

where Q11, Q21, and Q31 represent the charges stored in the first capacitor C1, second capacitor C2, and the capacitor of the organic light emitting diode OLED at the start point of the writing period P4 (the first time point), respectively. Vth represents the threshold voltage of the driving transistor TD, VL represents the second initialization voltage level of the third power VINT, Vref represents a reference voltage, ELVSS represents the voltage level of the second power. Cc1, Cc2, and Coled represent capacitances of the first capacitor, the second capacitor, and the capacitor of the organic light emitting diode, respectively.

At a time of writing the data voltage VDATA at which the K-th scan signal SCAN(k) having the turn-on level is applied to the pixel 10 (e.g., a second time point) during the writing period P4, the charges stored in the first capacitor C1, second capacitor C2, and the capacitor of the organic light emitting diode OLED in the pixel 10 may be expressed, for example, by Equations 4 to 6.

$$Q12 = (V\text{gate} - VL) \times Cc1 \quad (4)$$

$$Q22 = (V\text{gate} - V\text{DATA}) \times Cc2 \quad (5)$$

$$Q32 = (V\text{gate} - \text{ELVSS}) \times \text{Coled} \quad (6)$$

where Q11, Q21, and Q31 represent the charges stored in the first capacitor C1, second capacitor C2, and the capacitor of the organic light emitting diode OLED at the second time point (e.g., the data voltage VDATA is written on the K-th pixel row by the K-th scan signal SCAN(k)), respectively. Vth represents the threshold voltage of the driving transistor TD, VL represents the second initialization voltage level of the third power VINT, Vref represents a reference voltage, ELVSS represents the voltage level of the second power. Cc1, Cc2, and Coled represent capacitances of the first capacitor, the second capacitor, and the capacitor of the organic light emitting diode, respectively.

Since the first node N1 and the second node N2 (e.g., the gate electrode and source electrode of the driving transistor TD) may be a electrically disconnected state during the writing period P4, total amount of charges at the first and second time points may be substantially the same (i.e., Q11+Q21+Q31=Q12+Q22+Q32). The gate voltage of the driving transistor TD (the first node voltage VN1) may be calculated, for example, by Equation 7 based on Equations 1 to 6.

$$V\text{gate} = VDDL + Vth + (VDATA - Vref) \cdot \frac{Cc2}{(Cc1 + Cc2 + \text{Coled})} \quad (7)$$

where VDDL represents the second voltage level VDD_L of the first power ELVDD.

Thus, the gate voltage of the driving transistor TD in the writing period P4 may be determined based on the data voltage VDATA applied to the pixel 10 regardless other data voltages applied from the data driver at different timings.

Further, the gate electrode of the driving transistor TD and the anode of the organic light emitting diode OLED may be electrically disconnected during the writing period P4, so that the current leakage through the driving transistor TD for the writing period P4 and the fluctuation of the anode voltage caused thereby may be prevented. Thus, display defects such as luminance deviation, cross-talk of the pixels, etc., due to the current leakage may be prevented or improved.

In the emission period P5, the first power ELVDD may have the third voltage level VDD_H, the third power VINT may have the first initialization voltage level VH, and the scan signal SCAN(k) may have the turn-off level. That is, the third power VINT may rise from the second initialization voltage level VL to the first initialization voltage level VH and the first node voltage VN1 may rise corresponding to an amount of change of the third power VINT (e.g., VH-VL) in the emission period P5. Accordingly, the driving transistor may stably operate in the saturation region, the driving current I_OLED based on the data voltage VDATA may flow into the organic light emitting diode OLED through the driving transistor TD, and the organic light emitting diode OLED may emit light corresponding to the data voltage VDATA.

FIG. 5 illustrates another embodiment for controlling pixel 10 when a data voltage corresponding to the white image is applied to the pixel 10. As illustrated in FIG. 5, the driving current I_OLED may vary with a magnitude of the data voltage VDATA. As described above, the pixel 10 and driving method for the same according to example embodiments may implement the simultaneous emission type display device for performing the initialization and compensation based on the voltage level changes of the first and third powers ELVDD and VINT with a relatively simple circuit configuration of 3T2C. Thus, the simultaneous emission type display device can realize a high display resolution.

In addition, the first and second transistors T1 and T2 connected in series may be controlled by the different signals (e.g., the scan signal and the third power), so that the first node N1 and the third node N3 can be electrically separated from each other in the writing period P4. Thus, the current leakage from the driving transistor TD to the organic light emitting diode OLED by the data voltage VDATA write may be prevented and luminance deviation, cross-talk of the pixels due to the current leakage may be prevented or improved.

Figure 6:
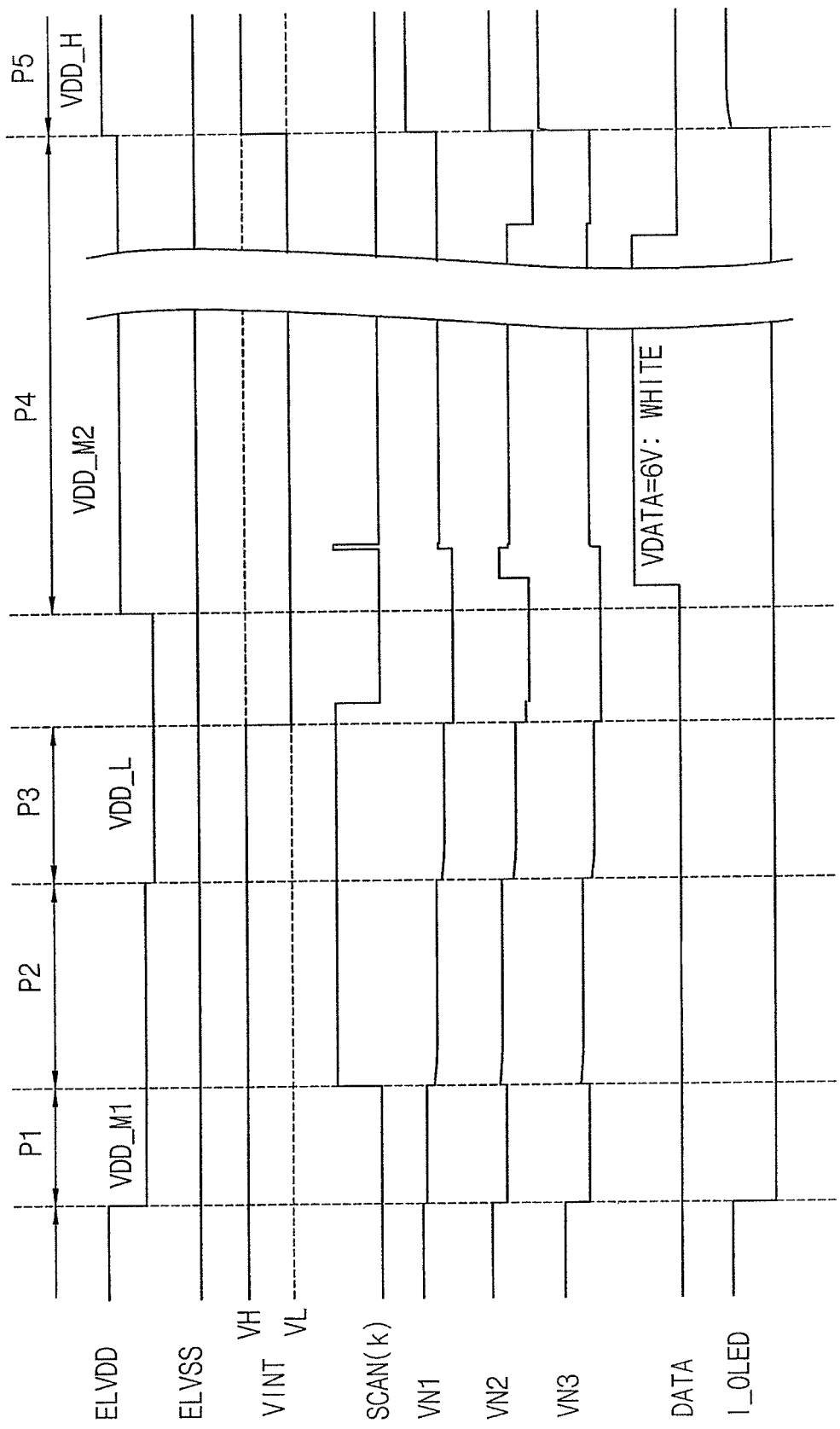
FIG. 6 illustrates an embodiment of signals for controlling the pixel.

FIG. 6 illustrates another embodiment of a timing diagram for controlling pixel 10 in FIG. 3. The operation of the pixel in FIG. 6 may be substantially the same as or similar to the operation in FIGS. 4 and 5, except for a voltage level of the first power in the writing period.

Referring to FIGS. 3 and 6, the pixel 10 may emit light based on a data voltage VDATA corresponding to a white image. The pixel 10 may operate substantially the same operation as FIG. 4 during the first initialization P1, the second initialization P2, and the compensation period P3. For example, a first voltage level VDD_M1 of the first power ELVDD in the first and second initialization periods P1 and P2 may be substantially the same as the first voltage level VDD_M of FIG. 4. A second voltage level VDD_L of the first power ELVDD in the compensation period P3 may be substantially the same as the second voltage level VDD_L of FIG. 4.

In the writing period P4, the first power ELVDD may have the first voltage level VDD_M1 or a third voltage level VDD_M2 greater than the first voltage level VDD_M1, the third power VINT may have the second initialization voltage level VL, and the scan signal SCAN(k) may have the turn-on level.

In the emission period P5, the first power ELVDD may have a fourth voltage level VDD_H greater than the third voltage level VDD_M2, the third power VINT may have the first initialization voltage level VH, and the scan signal SCAN(k) may have the turn-off level. For example, the fourth voltage level VDD_H may be substantially the same as the third voltage level VDDD_H in the emission period P5 of FIG. 4.

Namely, in the writing period P4, the third voltage level VDD_M2 of the first power ELVDD may be determined to be an optimal value to eliminate a current leakage path through the driving transistor TD. In some embodiments, the voltage level of the first power ELVDD in the writing period P4 (e.g., the third voltage level VDD_M2) may be greater than or equal to the first voltage level VDD_M1 and less than the fourth voltage level VDD_H. Accordingly, the current leakage through the driving transistor TD for the writing period P4 may be prevented.

Figure 7:
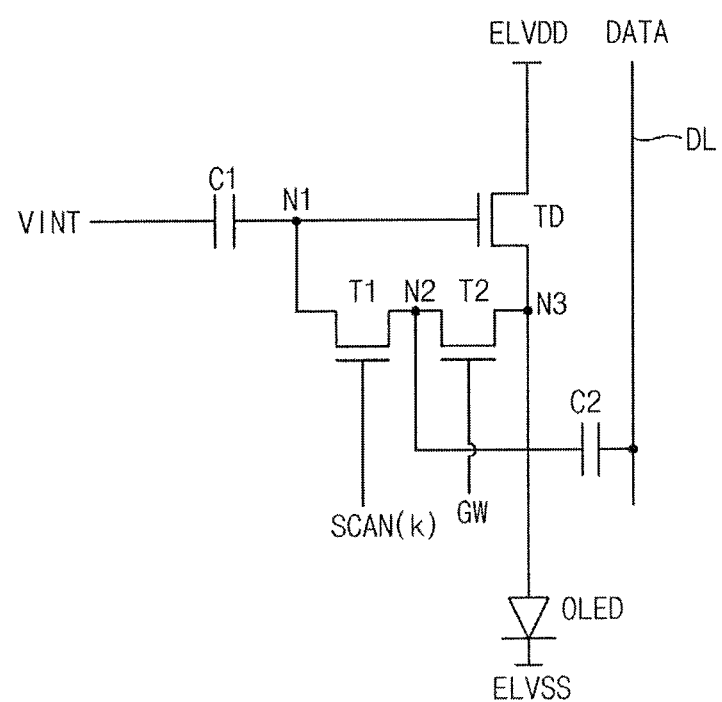
FIG. 7 illustrates another embodiment of a pixel.

FIG. 7 illustrates another embodiment of a pixel, which may be substantially the same as or similar to the pixel of FIG. 3 except for the method for driving the second transistor. Referring to FIG. 7, the pixel may include a first transistor T1, a second transistor T2, a driving transistor TD, a first capacitor C1, a second capacitor C2, and an organic light emitting diode OLED.

The first transistor T1, the second transistor T2, and the driving transistor TD may be NMOS transistors. For example, each of the first transistor T1, the second transistor T2, and the driving transistor TD may be an LTPS thin film transistor, an oxide thin film transistor, or an LTPO thin film transistor.

The first transistor T1 may be connected between a first node N1 and a second node N2. The first transistor T1 may include a gate electrode to receive a scan signal SCAN(k).

The second transistor T2 may be connected between the second node N2 and a third node N3 in series with the first transistor T1. The second transistor T2 may include a gate electrode to receive a global gate signal GW. In some embodiments, the global gate signal GW may be generated in a scan driver. The global gate signal GW may have a turn-on level in a first initialization period, a second initialization period, a compensation period, and an emission period, and have a turn-off level in a writing period. Thus, the second transistor T2 may be turned-on state in the first initialization period, the second initialization period, the compensation period, and the emission period.

The driving transistor TD may be connected between the first power ELVDD and the third node N3. The driving transistor TD may include a gate electrode connected to the first node N1. Emission luminance may be determined by a driving current I_OLED flowing through the driving transistor TD.

Figure 8:
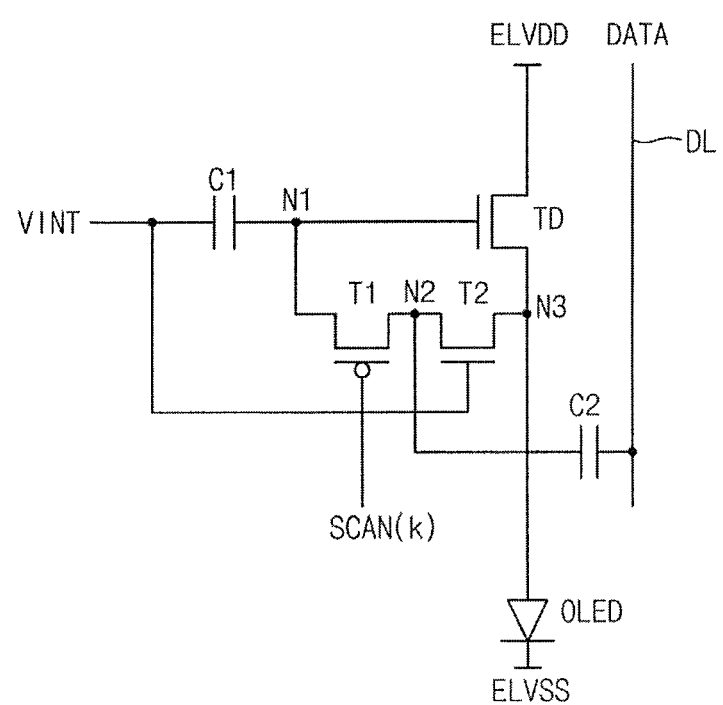
FIG. 8 illustrates another embodiment of a pixel.
Figure 9:
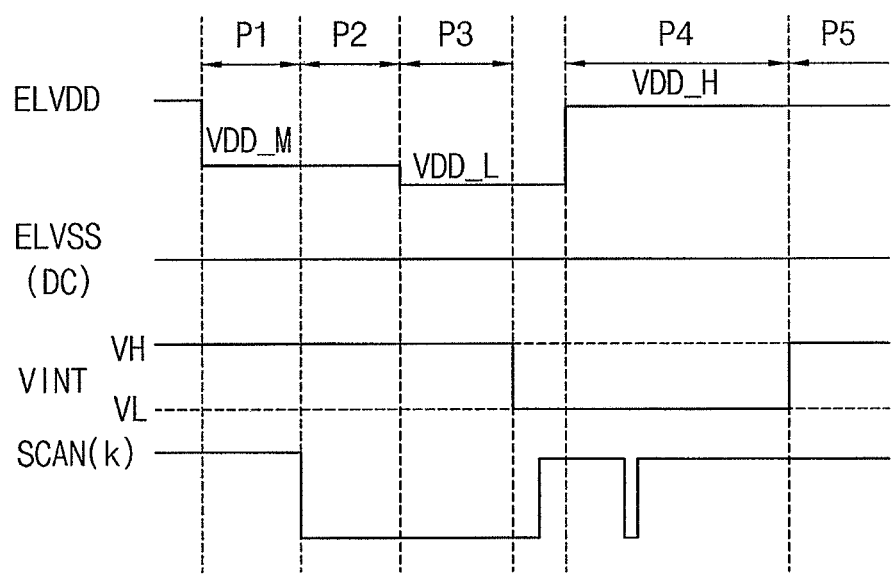
FIG. 9 illustrates an embodiment of signals for controlling the pixel in FIG. 8.

FIG. 8 illustrates another embodiment of a pixel in the display device of FIG. 1, and FIG. 9 illustrates an embodiment of a timing diagram for controlling the pixel in FIG. 8. The pixel of FIG. 8 may be substantially the same as or similar to the pixel of FIG. 3, except for the first transistor.

Referring to FIGS. 8 and 9, the pixel may include a first transistor T1, a second transistor T2, a driving transistor TD, a first capacitor C1, a second capacitor C2, and an organic light emitting diode OLED. In some embodiments, the driving transistor TD and the second transistor T2 may be NMOS transistors, and the first transistor T1 may be a p-channel metal oxide semiconductor (PMOS) transistor.

In some embodiments, the driving transistor TD and the second transistor T2 may be an oxide thin film transistor or an LTPS thin film transistor and the first transistor T1 may be an LTPS thin film transistor. In some embodiments, the driving transistor TD and the second transistor T2 may be an oxide thin film transistor formed by an LTPO process.

As illustrated in FIG. 9, the first transistor T1 may be the PMOS transistor, and thus a logic high level of the scan signal SCAN(k) applied to the gate electrode of the first transistor may be the turn-off level and a logic low level may be the turn-on level. As described above, the first transistor T1 controlled by the scan signal SCAN(k) may be replaced by the PMOS transistor and the pixel having the first transistor T1 may be applied to various types of display panel drivers.

Figure 10:
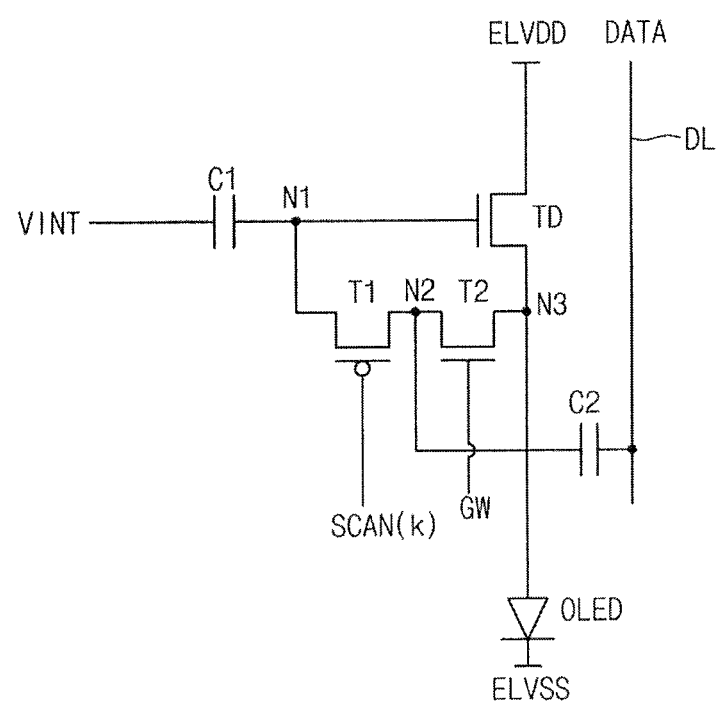
FIG. 10 illustrates another embodiment of a pixel.

FIG. 10 illustrates another embodiment of a pixel, which may be substantially the same as or similar to the pixel in FIG. 3, except for the method for driving the second transistor.

Referring to FIG. 10, the pixel may include a first transistor T1, a second transistor T2, a driving transistor TD, a first capacitor C1, a second capacitor C2, and an organic light emitting diode OLED. In some embodiments, the driving transistor TD and the second transistor T2 may be NMOS transistors, and the first transistor T1 may be a p-channel metal oxide semiconductor (PMOS) transistor.

The first transistor T1 may be connected between a first node N1 and a second node N2. The first transistor T1 may include a gate electrode to receive a scan signal SCAN(k).

The second transistor T2 may be connected between the second node N2 and a third node N3 in series with the first transistor T1. The second transistor T2 may include a gate electrode to receive a global gate signal GW. In some embodiments, the global gate signal GW may be generated in a scan driver. The global gate signal GW may have a turn-on level in a first initialization period, a second initialization period, a compensation period, and an emission period, and have a turn-off level in a writing period. Thus, the second transistor T2 may be turned-on state in the first initialization period, the second initialization period, the compensation period, and the emission period.

The driving transistor TD may be connected between the first power ELVDD and the third node N3. The driving transistor TD may include a gate electrode connected to the first node N1. Emission luminance may be determined by a driving current I_OLED flowing through the driving transistor TD.

Figure 11:
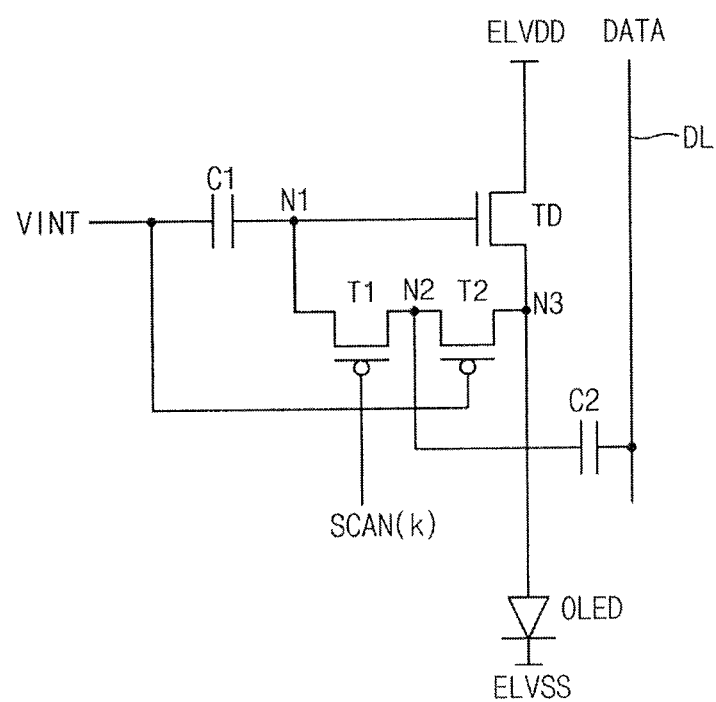
FIGS. 11 and 12 illustrate other embodiments of a pixel.
Figure 12:
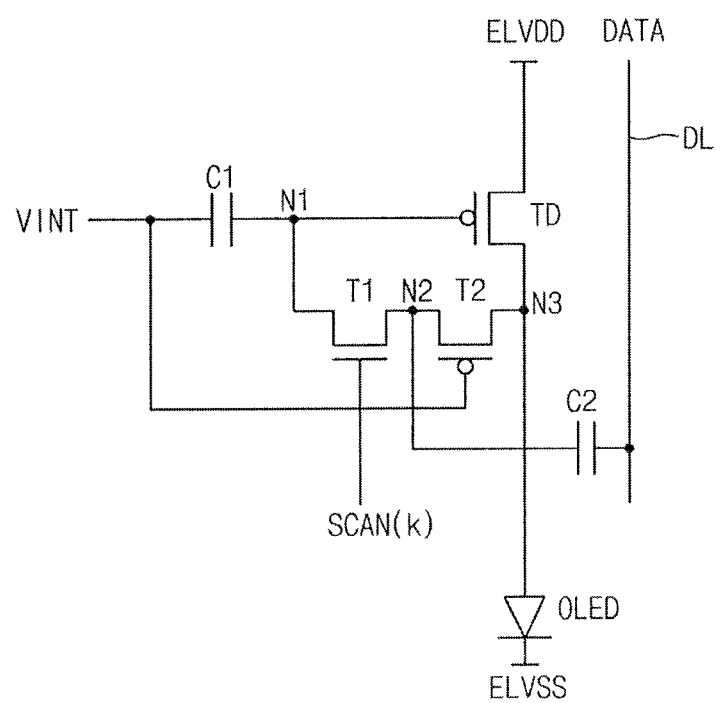

FIGS. 11 and 12 illustrate additional embodiments of the pixel in the display device of FIG. 1, which may be substantially the same as or similar to the pixel of FIG. 3 except for types of the transistors.

Referring to FIGS. 11 and 12, the pixel may include a first transistor T1, a second transistor T2, a driving transistor TD, a first capacitor C1, a second capacitor C2, and an organic light emitting diode OLED. The first transistor T1 may be connected between a first node N1 and a second node N2 and may include a gate electrode to receive a scan signal SCAN(k).

The second transistor T2 may be connected between the second node N2 and a third node N3 in series with the first transistor T1. The second transistor T2 may include a gate electrode to receive an initialization power VINT (e.g., a third power). The driving transistor TD may be connected between the first power ELVDD and the third node N3. The driving transistor TD may include a gate electrode connected to the first node N1. Emission luminance may be determined by a driving current I_OLED flowing through the driving transistor TD.

In some embodiments, as illustrated in FIG. 11, the driving transistor TD, the first transistor T1, and the second transistor T2 may be PMOS transistors. For example, the PMOS transistors may be LTPS thin film transistors. However, in this case, voltage levels of the initialization power VINT, first power ELVDD, and second power ELVSS may be changed in a manner different from the operations described in FIGS. 4 to 6.

In some embodiments, as illustrated in FIG. 12, the driving transistor TD and the second transistor T2 may be PMOS transistors and the first transistor T1 may be an NMOS transistor. In this case, voltage levels of the initialization power VINT, first power ELVDD, and second power ELVSS may be changed in a manner different from the operations described in FIGS. 4 to 6. Accordingly, the first node N1 (the gate electrode of the driving transistor TD) and the third node N3 (the anode) may be electrically separated from each other in the writing period P4.

Figure 13:
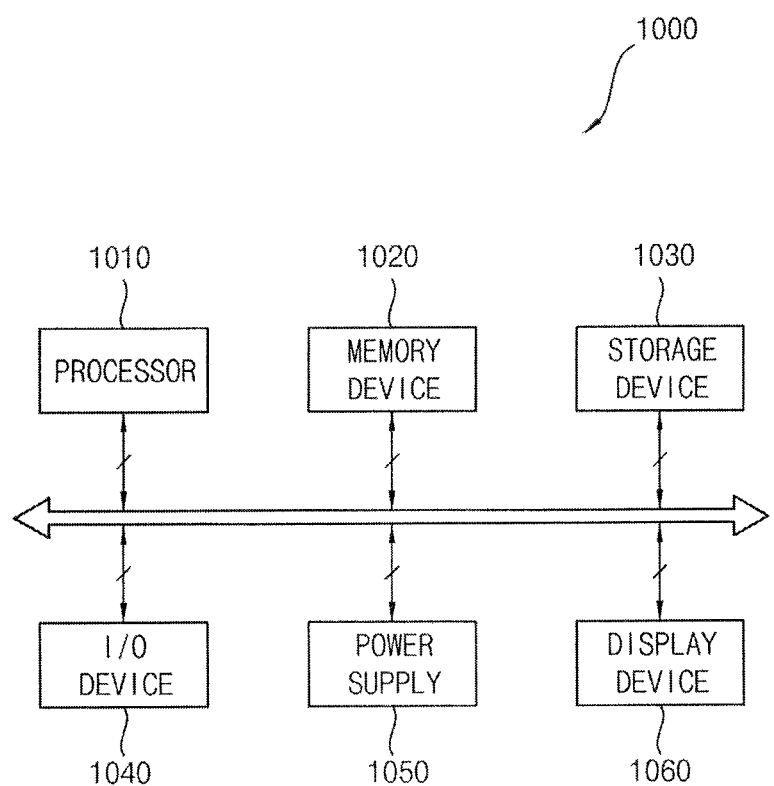
FIG. 13 illustrates an embodiment of an electronic device.
Figure 14:
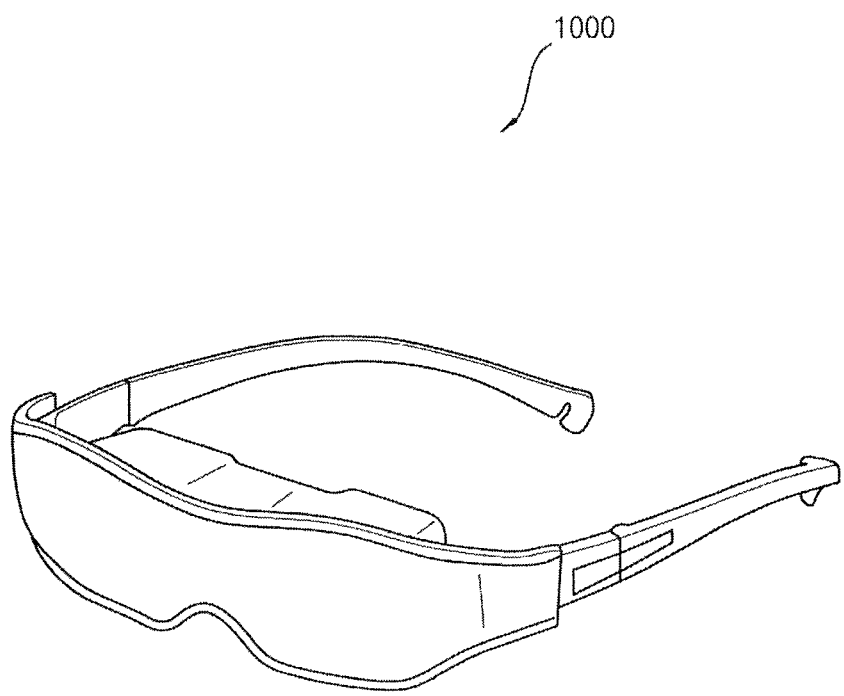
FIG. 14 illustrates an embodiment of in a head mount display.

FIG. 13 illustrates an embodiment of an electronic device 1000, and FIG. 14 illustrates an embodiment of an electronic device 1000 implemented in a head mount display. Referring to FIGS. 13 and 14, the electronic device 1000 may include a processor 1010, a memory device 1020, a storage device 1030, an input/output (I/O) device 1040, and a power supply 1050, and a display device 1060. The display device 1060 may correspond to the display device of FIG. 1 or 5.

In addition, the electronic device 1000 may further include a plurality of ports for communicating with a video card, a sound card, a memory card, a universal serial bus (USB) device, other suitable electronic devices, etc. In one embodiment, as illustrated in FIG. 14, the electronic device 1000 may be implemented in a head mount display (HMD). However, this is an example and the electronic device 7000 is not limited thereto. For example, the electronic device 1000 may be implemented in a television, a smart phone, virtual reality (VR) device, a cellular phone, a video phone, a smart pad, a smart watch, a tablet, a personal computer, a navigation for vehicle, a monitor, a notebook, and/or the like.

The processor 1010 may perform various suitable computing functions. The processor 1010 may be a microprocessor, a central processing unit (CPU), etc. The processor 1010 may be coupled to other suitable components via an address bus, a control bus, a data bus, etc. Furthermore, the processor 1010 may be coupled to an extended bus such as a peripheral component interconnection (PCI) bus.

The memory device 1020 may also store data for operations of the electronic device 1000. For example, the memory device 1020 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, and/or the like.

The storage device 1030 may store data for operations of the electronic device 7000. The storage device 1030 may be a solid state drive (SSD) device, a hard disk drive (HDD) device, a CD-ROM device, and/or the like. The I/O device 1040 may be an input device, such as a keyboard, a keypad, a touchpad, a touch-screen, a mouse, and/or the like, and an output device, such as a printer, a speaker, and/or the like. The power supply 1050 may provide power for operating the electronic device 1000.

The display device 1060 may be connected to other elements via the buses or other communication links. According to some example embodiments, the display device 1060 may be in the I/O device 1040. As described above, the display device 1060 may include a display panel comprising a plurality of pixels and a display panel driver to drive scan lines and data lines connected to the display panel and to provide an initialization power, a first power, and a second power to the display panel.

Each of the pixels in the display panel may include a first transistor connected between a first node and a second node and having a gate electrode configured to receive a scan signal, a second transistor connected between the second node and a third node in series with the first transistor and having a gate electrode configured to receive the initialization power (a third power), a driving transistor connected between the first power and the third node and having a gate electrode connected to the first electrode to control a driving current, an organic light emitting diode connected between the third node and the second power to emit light based on the driving current, a first capacitor connected between the initialization power and the first node, and a second capacitor connected between the second node and one of the data lines.

Therefore, the display device 1060 in the electronic device 1000 may perform the simultaneous emission with a relatively simple circuit configuration of 3T2C. Thus, the simultaneous emission type display device 1060 can realize a high display resolution.

The present embodiments may be applied to any display device and any system including the display device. For example, the present embodiments may be applied to a HMD device, a television, a computer monitor, a laptop, a digital camera, a cellular phone, a smart phone, a smart pad, a personal digital assistant (PDA), a portable multimedia player (PMP), a MP3 player, a navigation system, a game console, a video phone, etc.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The drivers, controllers, and other signal generating and signal processing features of the embodiments disclosed herein may be implemented in logic which, for example, may include hardware, software, or both. When implemented at least partially in hardware, the drivers, controllers, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the drivers, controllers, and other signal generating and signal processing features may include, for example, a memory or other storage device for storing code or instructions to be executed, for example, by a computer, processor, micropro-

What is claimed is:

1. A pixel of a display device, the pixel comprising:
a first transistor connected between a first node and a second node;
a second transistor connected between the second node and a third node in series with the first transistor;
a driving transistor connected between a source of first power and the third node and including a gate electrode connected to the first node;
an organic light emitting diode connected between the third node and a source of second power;
a first capacitor connected between a source of third power and the first node; and
a second capacitor connected between the second node and a data line.

2. The pixel as claimed in claim 1, wherein at least one of the first transistor, the second transistor and the driving transistor is a p-channel metal oxide semiconductor (PMOS) transistor.

3. The pixel as claimed in claim 1, wherein at least one of the first transistor, the second transistor and the driving transistor is an n-channel metal oxide semiconductor (NMOS) transistor.

4. The pixel as claimed in claim 1, wherein at least a first one of the first transistor, the second transistor and the driving transistor is a p-channel metal oxide semiconductor (PMOS) transistor, and
wherein at least a second one of the first transistor, the second transistor and the driving transistor is an n-channel metal oxide semiconductor (NMOS) transistor.

5. The pixel as claimed in claim 1, wherein the first transistor includes a gate electrode to receive a scan signal.

6. The pixel as claimed in claim 1, wherein the second transistor includes a gate electrode to receive a global gate signal.

7. The pixel as claimed in claim 1, wherein the second transistor includes a gate electrode to receive the third power.

8. The pixel as claimed in claim 1, wherein the first power has at least three voltage levels,
wherein the second power has a constant voltage, and
wherein the third power has two voltage levels.

9. A display device, comprising:
a display panel including a plurality of pixels; and
a display panel driver to drive a plurality of scan lines and a plurality of data lines and to provide first power, second power, and third power, wherein each of the pixels includes:
a first transistor connected between a first node and a second node;
a second transistor connected between the second node and a third node in series with the first transistor;
a driving transistor connected between a source of the first power and the third node and including a gate electrode connected to the first node;
an organic light emitting diode connected between the third node and a source of the second power;
a first capacitor connected between a source of the third power and the first node; and
a second capacitor connected between the second node and one of the data lines.

10. The device as claimed in claim 9, wherein the display panel is to be driven in a frame which includes:
a first initialization period to initialize a third node voltage,
a second initialization period after the first initialization period to initialize a gate voltage of the driving transistor,
a compensation period after the second initialization period to compensate a threshold voltage of the driving transistor,
a writing period after the compensation period to sequentially write data voltages, and
an emission period after the writing period in which the pixels are to simultaneously emit light.

11. The device as claimed in claim 10, wherein:
the first power has one of a first voltage level, a second voltage level less than the first voltage level, or a third voltage level greater than the first voltage level, and
the third power has one of a first initialization voltage level to turn on the second transistor or a second initialization voltage level less than the first initialization voltage level to turn off the second transistor.

12. The device as claimed in claim 11, wherein in the first initialization period:
the first power has the first voltage level less than the second power,
the third power has the first initialization voltage level, and
a scan signal applied to the first transistor has a turn-off level.

13. The device as claimed in claim 11, wherein in the second initialization period:
the first power has the second voltage level,
the third power has the first initialization voltage level, and
a scan signal applied to the first transistor has a turn-on level.

14. The device as claimed in claim 11, wherein in the compensation period:
the first power has the second voltage level,
the third power has the first initialization voltage level, and
a scan signal applied to the first transistor has a turn-on level.

15. The device as claimed in claim 11, wherein in the writing period:
the first power has the third voltage level greater than the second power,
the third power has the second initialization voltage level,
a scan signal applied to the first transistor has a turn-on level and is to be sequentially provided to the scan lines in an order of pixel rows, and
the second transistor is to be turned off to electrically disconnect the first node and the third node.

16. The device as claimed in claim 11, wherein in the emission period:
the first power has the third voltage level greater than the second power, the third power has the first initialization voltage level, and a scan signal applied to the first transistor has a turn-off level.

17. The device as claimed in claim 11, wherein in the writing period:
    the first power has the first voltage level or the third voltage level,
    the third power has the second initialization voltage level, and
    a scan signal applied to the first transistor has a turn-on level and is to be sequentially provided to the scan lines in an order of pixel rows.

18. The device as claimed in claim 17, wherein in the emission period:
    the first power has a fourth voltage level greater than the third voltage level,
    the third power has the first initialization voltage level, and
    the scan signal has a turn-off level.

19. The device as claimed in claim 10, wherein the display panel driver is to:
    provide the first power at a first voltage level less than the second power during the first and second initialization periods,
    provide the first power at a second voltage level less than the first voltage level during the compensation period, and
    provide the first power at a third voltage level greater than the second power during the writing and emission periods.

20. The device as claimed in claim 10, wherein the display panel driver is to:
    provide the first power at a first voltage level less than the second power during the first and second initialization periods,
    provide the first power at a second voltage level less than the first voltage level during the compensation period,
    provide the first power at a third voltage level greater than the first voltage level during the writing period, and
    provide the first power at a fourth voltage level greater than the first voltage level and the second power during the emission period.

* * * * *